(12) United States Patent
St. Germain et al.

(10) Patent No.: US 8,680,938 B2
(45) Date of Patent: Mar. 25, 2014

(54) APPARATUS AND METHOD FOR EQUALIZATION

(75) Inventors: Michael St. Germain, Somerville, MA (US); Jennifer Lloyd, North Andover, MA (US); Kimo Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 340 days.

(21) Appl. No.: 13/093,372

(22) Filed: Apr. 25, 2011

(65) Prior Publication Data

US 2012/0268204 A1  Oct. 25, 2012

(51) Int. Cl.
*H04B 3/14* (2006.01)
*H03F 3/45* (2006.01)

(52) U.S. Cl.
USPC .................................. 333/28 R; 330/252

(58) Field of Classification Search
USPC .............. 333/28 R; 327/52, 65, 89, 246, 266, 327/274, 280, 287, 359, 563; 330/252
See application file for complete search history.

(56) References Cited

U.S. PATENT DOCUMENTS

| 7,760,013 | B2 | 7/2010 | Bankman et al. |
| 7,990,217 | B2 | 8/2011 | Gilbert et al. |
| 8,274,326 | B2 * | 9/2012 | Boecker ........................ 327/559 |

* cited by examiner

*Primary Examiner* — Benny Lee
*Assistant Examiner* — Rakesh Patel
(74) *Attorney, Agent, or Firm* — Knobbe, Martens, Olson & Bear, LLP

(57) ABSTRACT

Apparatus and methods for equalization are provided. In one embodiment, an apparatus for equalizing an input voltage includes a first capacitor and a first resistor having a first end and a second end, the first end configured to receive the input voltage. The apparatus further includes a second resistor having a first end electrically connected to the second end of the first resistor at an output node. The apparatus further includes an inverting voltage buffer for substantially inverting the input voltage to generate an inverted input voltage. The apparatus further includes a transconductance buffer for receiving the inverted input voltage and for generating a current from a first end of the first capacitor to the output node having a magnitude equal to about the magnitude of the input voltage signal divided by the impedance of the first capacitor.

23 Claims, 10 Drawing Sheets

APPARATUS AND METHOD FOR EQUALIZATION

BACKGROUND

1. Field

Embodiments of the invention relate to electronic devices, and more particularly, to equalizers.

2. Description of the Related Technology

Certain electronic systems can include a transmission line for communicating electronic signals from a transmitter to a receiver. Transmission line losses can increase signal jitter and hinder communication at relatively high speeds. For example, dielectric loss and/or skin effect mechanisms in the transmission line can attenuate high frequency components of the transmitted signal, thereby introducing signal distortion.

In certain instances, a receiver can include an equalizer for compensating for high-frequency signal loss. The equalizer can be configured to boost high frequency components of a signal relative to low frequency components of the signal, thereby improving signal fidelity.

There is a need for improved equalizer circuits.

SUMMARY

In one embodiment, an apparatus includes a capacitor block having a first terminal and a second terminal and a first resistor having a first end and a second end. The first end of the first resistor is configured to receive a first input of a differential input voltage. The apparatus further includes a second resistor having a first end electrically connected to the second end of the first resistor at a first output node, and a third resistor having a first end and a second end. The first end of the third resistor is configured to receive a second input of the differential input voltage. The third resistor has a resistance equal to about that of the first resistor. The apparatus further includes a fourth resistor having a first end electrically connected to the second end of the third resistor at a second output node, the fourth resistor having a resistance equal to about that of the second resistor. The apparatus further includes a first transconductance buffer configured to receive the first input voltage and to generate a first current from the second output node to the first terminal of the capacitor block, the first current proportional to about the first input voltage. The apparatus further includes a second transconductance buffer configured to receive the second input voltage and to generate a second current from the first output node to the second terminal of the capacitor block, the second current proportional to about the second input voltage. The first and second output nodes are configured to provide a first differential output.

In another embodiment, an apparatus for equalizing an input voltage includes a first resistor having a first end and a second end, the first end configured to receive the input voltage. The apparatus further includes a second resistor having a first end electrically connected to the second end of the first resistor at an output node. The apparatus further includes an inverting voltage buffer for substantially inverting the input voltage to generate an inverted input voltage. The apparatus further includes a first capacitor and a transconductance buffer for receiving the inverted input voltage and for generating a current from a first end of the first capacitor to the output node, the current equal to about the input voltage divided by the impedance of the first capacitor.

In another embodiment, a method of equalizing an input voltage signal is provided. The method includes providing a capacitor, the capacitor having a first end electrically connected to a first voltage reference. The method further includes providing a first resistor, the first resistor including a first end for receiving the input voltage signal and a second end for providing an output voltage signal. The method further includes providing a second resistor, the second resistor including a first end electrically connected to the second end of the first resistor and a second end electrically connected to a second voltage reference. The first and second resistors are configured to attenuate a DC component of the input voltage signal. The method further includes generating a current to the second end of the first resistor, the current having the same polarity as the input voltage and having a magnitude proportional to the magnitude of the input voltage divided by the impedance of the capacitor.

DETAILED DESCRIPTION OF EMBODIMENTS

Figure 1:
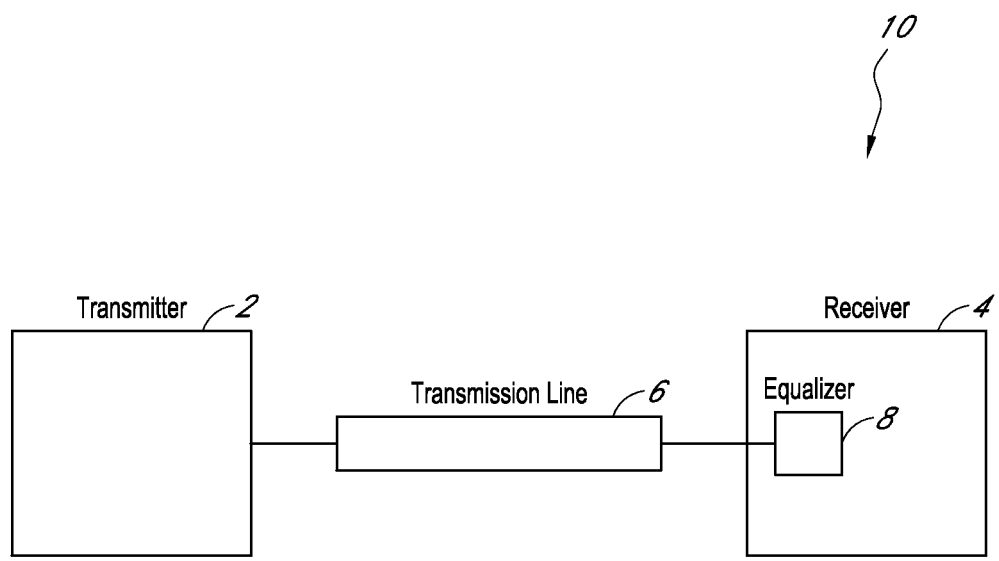
FIG. 1 is a schematic block diagram of an electronic system having an equalizer.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Equalization in Electronic Systems

FIG. 1 is a schematic block diagram of an electronic system 10. The electronic system 10 includes a transmitter 2 electrically connected to a first end of a transmission line 6, and a receiver 4 electrically connected to a second end of the transmission line 6. The receiver 4 includes an equalizer 8 to aid in compensating for transmission line losses.

The transmitter 2 and the receiver 4 can communicate over the transmission line 6 using a variety of signaling techniques. For example, the transmitter 2 and the receiver 4 can communicate using non-return-to-zero (NRZ) signaling. The signal communicated over the transmission line 6 can be single-ended or differential. Although not illustrated in FIG. 1, the transmission line can be terminated at the transmitter 2 and/or the receiver 4 using one or more termination impedances. For example, when using differential signaling, the receiver 4 can include a differential termination impedance of about 100Ω. Similarly, when using single-ended signaling, the receiver 4 can have a termination impedance of about 50Ω.

The electronic system 10 can be used in a wide variety of applications. For example, the transmitter 2 can be used to transmit high-speed video to the receiver 4, using, for example, a High-Definition Multimedia Interface (HDMI) supporting a differential data stream having a data rate of about 3.7 Gbps. The electronic system 10 can also be used in other applications, including, for example, networking applications using 4.25 Gbps Fibre Channel and 3.25 Gbps XAUI technologies.

The transmitter 2 and the receiver 4 can each be positioned on a common electronic circuit board, and the transmission line 6 can include circuit board microstrip trace. Alternatively, the transmitter 2 and the receiver 4 can be disposed on separate electronic circuit boards electrically connected to a backplane, and the transmission line 6 can include a backplane trace, such as a conductive trace on FR-4 material having a length of up to about 40 inches. The transmission line 6 can act as a low pass filter, thereby introducing signal jitter and reducing performance of the electronic system 10 at relatively high speeds, such as differential serial rates greater than about 1 Gbps. In certain embodiment, the transmitter 2 and the receiver 4 can be in different physical housings, and the transmission line 6 can include a cable and one or more connectors.

The electronic system 10 can include other components, inputs and/or outputs. For example, the electronic system 10 can include additional receivers and/or transmitters, and a crosspoint switch for providing enhanced connectivity between the components. The crosspoint switch can also be configured to provide additional functionality, such as signal multicasting and/or broadcasting.

Overview of Equalizer Circuits

Equalizer circuits are described herein for improving fidelity of a signal. In certain embodiments, the equalizer circuit can include a plurality of resistors connected end-to-end in series, and configured to receive the signal at a first end. Intermediate connections between the series of resistors can be provided to a multiplexer, and each intermediate connection can provide a different degree of DC attenuation of the input signal. The multiplexer can be configured to select amongst the intermediate connections of the resistors to provide an output signal having the desired DC attenuation. The equalizer circuit can further include a transconductance buffer for generating a current from a first end of a capacitor to one of the intermediate connections of the series of resistors. The current can have a magnitude equal to about the input voltage signal divided by the capacitance of the capacitor, and can have the same polarity as the input voltage signal. The transfer function of the equalizer circuit can include a zero which can be controlled by choosing the resistance of the resistors, the capacitance of the capacitor, and the selected input of the multiplexer.

Figure 2A:
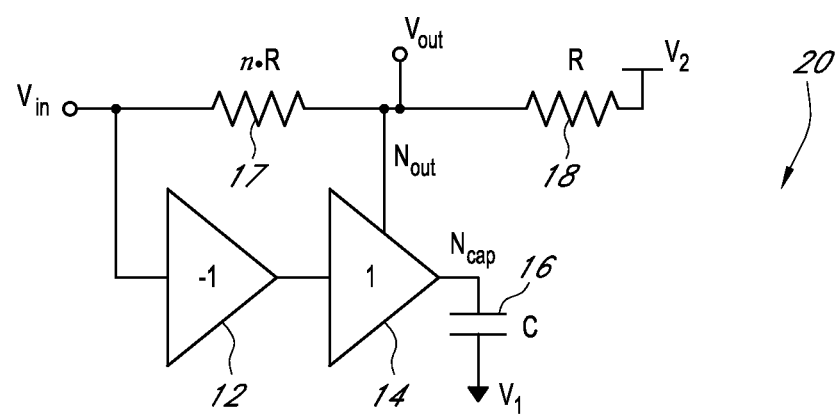
FIG. 2A is a circuit diagram of an equalizer in accordance with one embodiment.

FIG. 2A is a circuit diagram of an equalizer 20 in accordance with one embodiment. The equalizer 20 includes an inverting voltage buffer 12, a transconductance buffer 14, a capacitor 16, a first resistor 17, and a second resistor 18.

The inverting voltage buffer 12 includes an input electrically connected to a first end of the first resistor 17. The input of the inverting voltage buffer 12 and the first end of the first resistor 17 are configured to receive an input voltage signal $V_{in}$. The inverting voltage buffer 12 further includes an output electrically connected to an input of the transconductance buffer 14. The capacitor 16 includes a first end electrically connected to the transconductance buffer 14 at a node $N_{cap}$, and a second end electrically connected to a first voltage reference $V_1$. The first resistor 17 includes a second end electrically connected to a first end of the second resistor 18, and to a current output of the transconductance buffer 14 at a node $N_{out}$. The second resistor 18 includes a second end electrically connected to a second voltage reference $V_2$. The first and second voltage references $V_1$, $V_2$ can be, for example, positive and negative power supplies, respectively. The second end of the first resistor 17, the first end of the second resistor 18, and the current output of the transconductance buffer can generate the output voltage signal $V_{out}$.

The first resistor 17 can have a resistance equal to about n*R, and the second resistor 18 can have a resistance equal to about R. Thus, the equalizer 20 can have a DC attenuation from input to output equal to about 1/(n+1). The value of n can be selected to attenuate low-frequency components of the input signal relative to high-frequency components, while still providing an output signal having sufficient amplitude for amplification by a subsequent gain stage. In one embodiment, the DC attenuation is selected to be in the range of about 3 dB to about 12 dB. Since the input voltage signal $V_{in}$ can be received over a transmission line and have attenuated high frequency signal components, configuring the equalizer 20 to attenuate low-frequency signal components can aid in improving signal fidelity.

The inverting voltage buffer 12 can be configured to invert the input voltage signal $V_{in}$, and to provide the inverted signal to the input of the transconductance buffer 14. Although the inverting voltage buffer 12 is illustrated as having a gain of −1, the gain of the inverting voltage buffer 12 can have any suitable magnitude, such as a magnitude in the range of about 0.1 to about 100.

The transconductance buffer 14 includes an input for receiving the inverted version of the input voltage signal $V_{in}$, and a current output for generating a current from the node $N_{cap}$ to the node $N_{out}$ that is equal to about the input voltage divided by the impedance of the capacitor 16. For example, in certain implementations, the current I can be given by equation (1) below, where $g_m$ is the transconductance of the transconductance buffer 14, $\omega$ is the angular frequency of the input voltage signal $V_{in}$, and C is the capacitance of the capacitor 16. Additionally, the ratio of the transconductance $g_m$ to the capacitance C can be selected to be relatively greater than angular frequency $\omega$. Selecting the ratio of the transconductance $g_m$ to the capacitance C to be relatively greater than the angular frequency $\omega$ over the frequency band of interest can aid in generating a current from the transconductance buffer 14 that is about equal to about the input voltage divided by the impedance of the capacitor 16.

$$I = \left[\frac{V_{in}}{1/(j\omega C)}\right] * \left[\frac{1}{1 + j\omega C/g_m}\right] \qquad \text{Equation 1}$$

In one implementation, the transconductance buffer 14 is configured to equalize backplane and/or PCB trace over a frequency ranging between about 1 GHz to about 500 GHz, and the transconductance buffer 14 has a transconductance $g_m$ in the range of about 40 μA/V to about 4 A/V and the capacitor 16 has a capacitance C in the range of about 0.1 fF to about 3 nF. The transconductance buffer 14 can also have a relatively high input impedance, such as an input impedance greater than about 0.4 kΩ. The transconductance buffer 14 can include one or more bias circuits for biasing the transconductance buffer, as will be described in detail further below.

Inclusion of the transconductance buffer 14 can aid in producing a zero in the transfer function of the equalizer 20. For example, the equalizer 20 can have a transfer function in the Laplace domain equal to about $(1/(n+1))*(1+n*RCs)$, where s is the complex parameter of the Laplace transform, and n, R and C are as defined above. Thus, the equalizer 20 can have a left-hand-plane (LHP) zero in the s-plane at an angular frequency of about $1/(n*RC)$. The zero can help the equalizer 20 operate as a high pass filter and improve signal fidelity, as described above. By choosing the magnitude of n, R and C, the frequency of the zero can be selectively controlled to achieve the desired frequency response characteristic of the equalizer 20.

The transconductance buffer 14 can be implemented in a variety of ways. For example, as will be described in further detail below, the transconductance buffer 14 can be implemented using one or more bipolar and/or field effect transistors.

The first and second resistors 17, 18 can be any suitable resistor, such as polysilicon resistors having geometries selected to achieve the desired resistances. In one embodiment, the first and second resistors 17, 18 can have resistances which sum to a resistance ranging between about 50Ω to about 10 Mega-Ω. As will be described below, the resistors 17, 18 can be constructed using a plurality of resistive elements.

The capacitor 16 can be formed using, for example, conductive processing layers, such as polysilicon or metal, separated by a dielectric layer. Alternatively, the capacitor 16 can include one or more transistors, such as metal-oxide-semiconductor (MOS) transistors, sized and biased to achieve the desired capacitance. The capacitance C can be selected to be any of a variety of values, including, for example, a capacitance in the range of about 0.1 fF to about 3 nF, or more particularly, about 50 fF to about 1 pF. In one embodiment, the capacitor 16 is a programmable capacitor, which can be selectively controlled to tune the location of the zero of the equalizer 20. As described above, the second end of capacitor 16 can be electrically connected to the second voltage reference $V_2$, which can be, for example, a ground or negative supply, a positive power supply, or any suitable DC bias node. Additional details of the capacitor 16 can be as described below with reference to FIGS. 3-5B.

Figure 2B:
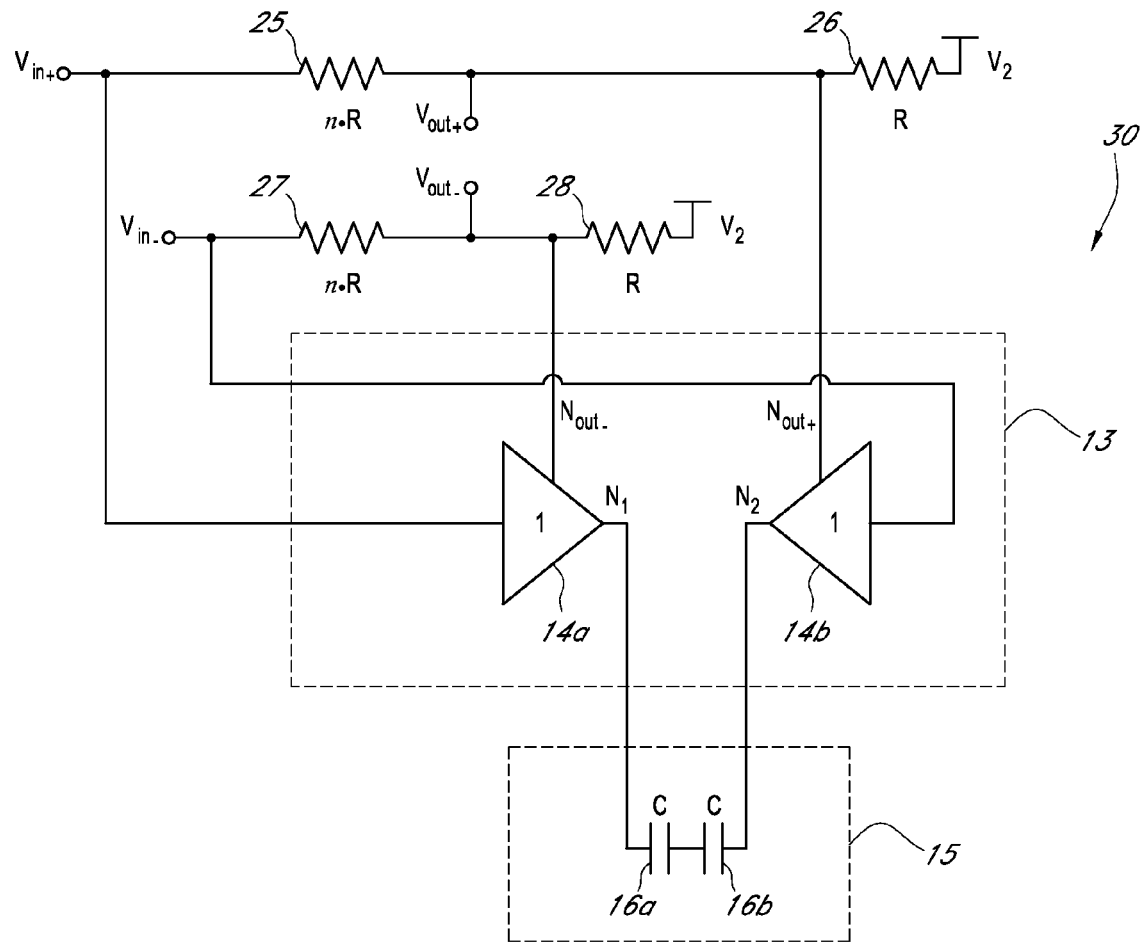
FIG. 2B is a circuit diagram of an equalizer in accordance with another embodiment.

FIG. 2B is a circuit diagram of an equalizer 30 in accordance with another embodiment. The equalizer 30 includes transconductance buffer block 13, capacitor block 15, first resistor 25, second resistor 26, third resistor 27, and fourth resistor 28. The transconductance buffer block 13 includes transconductance buffers 14a, 14b, and the capacitor block 15 includes capacitors 16a, 16b.

The capacitor 16a includes a first end electrically connected to a first terminal of the capacitor block 15. The capacitor 16b includes a first end electrically connected to a second terminal of the capacitor block 15, and a second end electrically connected to a second end of the first capacitor 16a at a node which can be AC grounded. Although the capacitor block 15 is illustrated for the case of two capacitors in series, persons of ordinary skill in the art will appreciate that a the capacitor block 15 can include capacitors connected in series and/or in a differential configuration. For example, in one embodiment, a capacitor is disposed between the first and second terminals of the capacitor block 15.

The transconductance buffer 14a includes an input electrically connected to a first end of the first resistor 25. The input of the transconductance buffer 14a and the first end of the first resistor 25 are configured to receive the positive or non-inverted input voltage signal $V_{in+}$. The first terminal of the capacitor block 15 and the first end of the capacitor 16a are electrically connected to the transconductance buffer 14a at a node $N_1$.

Similarly, the transconductance buffer 14b includes an input electrically connected to a first end of the third resistor 27. The input of the transconductance buffer 14b and the first end of the third resistor 27 are configured to receive the negative or inverted input voltage signal $V_{in-}$. The positive or non-inverted input voltage signal $V_{in+}$ and negative or inverted input voltage signal $V_{in-}$ collectively form a differential input voltage signal. The second terminal of the first capacitor block 15 and the first end of the capacitor 16b are electrically connected to the transconductance buffer 14b at a node $N_2$.

The first resistor 25 includes a second end electrically connected to a first end of the second resistor 26, and to a current output of the transconductance buffer 14b at a node $N_{out+}$. The second resistor 26 includes a second end electrically connected to the second voltage reference $V_2$. The third resistor 27 includes a second end electrically connected to a first end of the fourth resistor 28, and to a current output of the transconductance buffer 14a at a node $N_{out-}$.

The second end of the first resistor 25, the first end of the second resistor 26, and the current output of the transconductance buffer 14b can generate the positive or non-inverted output voltage signal $V_{out+}$. The second end of the third resistor 27, the first end of the fourth resistor 28, and the current output of the transconductance buffer 14a can generate the negative or inverted output voltage signal $V_{out-}$. The positive output voltage signal $V_{out+}$ and negative output voltage signal $V_{out-}$ collectively form a differential output voltage signal. The fourth resistor 28 includes a second end electrically connected to the second voltage reference $V_2$.

In contrast to the equalizer 20 illustrated in FIG. 2A, the illustrated equalizer 30 of FIG. 2B does not include the inverting voltage buffer 12. Rather, the transconductance buffers 14a, 14b can receive an input of a first polarity and can provide a current to an output of the opposite polarity. For example, as described above, the first transconductance buffer 14a can receive the positive input voltage signal $V_{in+}$ and can generate a current for the node $N_{out-}$. Similarly, the second transconductance buffer 14b can receive the negative input voltage signal $V_{in-}$ and can generate a current for the node $N_{out+}$. By cross-coupling the current outputs of the transconductance buffers 14a, 14b in this manner, the equalizer 30 can be implemented without using inverting voltage buffers.

The first and third resistors 25, 27 can each have a resistance equal to about $n*R$, and the second and fourth resistors 26, 28 can each have a resistance equal to about R. Thus, the equalizer 30 can have a DC attenuation from the input to the output equal to about $1/(n+1)$. Additional details of resistors 25-28 can be similar to those described above with reference to FIG. 2A.

The capacitors 16a, 16b can each have a capacitance equal to about C. Additional detail of the capacitor can be as described earlier.

The transconductance buffer 14a includes an input for receiving the positive input voltage $V_{in+}$ and a current output for generating a current from the node $N_{out-}$ to the node $N_1$ that is about equal to the positive input voltage $V_{in+}$ divided by the impedance of the capacitor 16a. Similarly, the transconductance buffer 14a includes an input for receiving the negative input voltage $V_{in-}$ and a current output for generating a current from the node $N_{out+}$ to the node $N_2$ that is about equal to negative input voltage $V_{in-}$ divided by the impedance of the capacitor 16b. Inclusion of the transconductance buffers 14a, 14b can aid in producing a zero in the transfer function of the equalizer 30. Additional details of transconductance buffers 14a, 14b can be similar to that described above.

Figure 3:
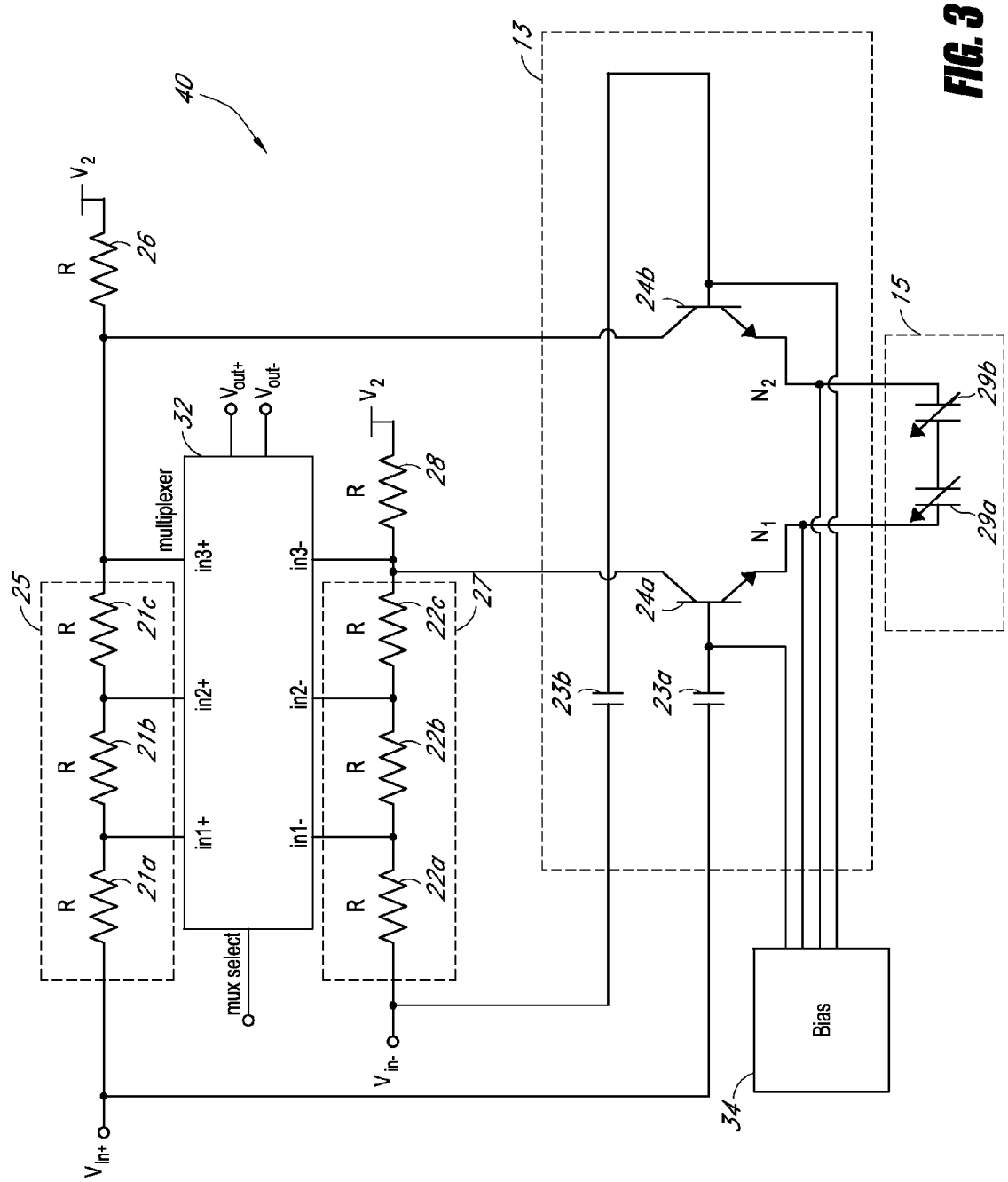
FIG. 3 is a circuit diagram of an equalizer in accordance with yet another embodiment.

FIG. 3 is a circuit diagram of an equalizer 40 in accordance with another embodiment. The equalizer 40 includes transconductance buffer block 13, capacitor block 15, first resistor 25, second resistor 26, third resistor 27, fourth resistor 28, multiplexer 32, and transconductance buffer bias block 34. The first resistor 25 includes resistor segments 21a-21c, and third resistor 27 includes resistor segments 22a-22c. The capacitor block 15 includes a first programmable capacitor 29a and a second programmable capacitor 29b.

The programmable capacitor 29a includes a first end electrically connected to a first terminal of the capacitor block 15. The programmable capacitor 29b includes a first end electrically connected to a second terminal of the capacitor block 15, and a second end electrically connected to a second end of the first programmable capacitor 29a at a node which can be AC grounded. Although the capacitor block 15 is illustrated for the case of two programmable capacitors in series, persons of ordinary skill in the art will appreciate that a the capacitor block 15 can include any suitable combination of programmable and fixed capacitors connected in a differential and/or series configuration.

The transconductance buffer block 13 includes first and second capacitors 23a, 23b and first and second NPN bipolar transistors 24a, 24b for serving as transconductance buffers. The first and second NPN bipolar transistors 24a, 24b each include an emitter, a base, and a collector. The first capacitor 23a includes a first end electrically connected to a first end of the resistor segment 21a, and a second end electrically connected to the base of the first NPN bipolar transistor 24a and to a first bias node of the transconductance buffer bias block 34. The second capacitor 23b includes a first end electrically connected to a first end of the first resistor segment 22a, and a second end electrically connected to the base of the second NPN bipolar transistor 24b and to a second bias node of the transconductance buffer bias block 34. The first end of the first capacitor 23a and the first end of the first resistor segment 21a are configured to receive the positive or non-inverting input voltage signal $Vin_+$, and the first end of the second capacitor 23b and the first end of the first resistor segment 22a are configured to receive the negative or inverting input voltage signal $V_{in-}$. The positive input voltage signal $V_{in+}$ and the negative input voltage signal $V_{in-}$ collectively form a differential input signal.

The first and second capacitors 23a, 23b can aid in biasing the NPN bipolar transistors 24a, 24b. The first and second capacitors 23a, 23b can have, for example, a capacitance selected from a range of about 0.1 fF to about 3 nF, or more particularly, between about 50 fF to about 1 pF.

The first NPN bipolar transistor 24a includes an emitter electrically connected to the first terminal of the capacitor block 15, to the first end of the first programmable capacitor 29a and to a third bias node of the transconductance buffer bias block 34 at a node labeled $N_1$. Similarly, the second NPN bipolar transistor 24b includes an emitter electrically connected to the second terminal of the capacitor block 15, to the first end of the second programmable capacitor 29b and to a fourth bias node of the transconductance buffer bias block 34 at a node labeled $N_2$. The first and second NPN bipolar transistors 24a, 24b can have, for example, a current gain or beta ("β") in the range of about 2 to about 1000.

The first and second programmable capacitors 29a, 29b can have a programmable capacitance which can aid in tuning the frequency of the zero of the equalizer 40, as will be described in detail below. In one embodiment, the programmable capacitors each have a capacitance which can be varied between about 0.1 fF to about 3 nF, or more particularly, between about 50 fF to about 1 pF. However, other ranges of capacitance will be readily determined by one of skill in the art. Additional details of the first and second programmable capacitors 29a, 29b will be described below with reference to FIGS. 5A-5B.

The transconductance buffer bias block 34 can aid in biasing the transconductance buffer block 13. For example, the transconductance buffer bias block 34 can include a common mode feedback loop for biasing the common mode voltage at the input of the bases of the first and second NPN bipolar transistors 24a, 24b. Additional details of the transconductance buffer bias block 34 can be as described below with reference to FIGS. 4A-4B.

The first resistor 25 includes resistor segments 21a-21c. The first resistor segment 21a includes a first end electrically connected to the first end of the capacitor 23a. As described above, the first end of the first resistor segment 21a and the first end of the capacitor 23a are configured to receive the positive or non-inverted input voltage signal $V_{in+}$. The first resistor segment 21a further includes a second end electrically connected to a first end of the second resistor segment 21b at a node configured to provide a first non-inverted multiplexer input to the multiplexer 32. The second resistor segment 21b further includes a second end electrically connected to a first end of the third resistor segment 21c and is configured to provide a second non-inverted multiplexer input to the multiplexer 32. The resistor segment 21c further includes a second end electrically connected to the collector of NPN bipolar transistor 24b and to a first end of the second resistor 26 and is configured to provide a third non-inverted multiplexer input to the multiplexer 32. The second resistor 26 includes a second end electrically connected to a second voltage reference $V_2$.

The third resistor 27 includes resistor segments 22a-22c. The first resistor segment 22a includes a first end electrically connected to the first end of the second capacitor 23b. As described above, the first end of the first resistor segment 22a and the first end of the second capacitor 23b are configured to receive a negative or non-inverted input voltage signal $V_{in-}$. The first resistor segment 22a further includes a second end electrically connected to a first end of the second resistor segment 22b and is configured to provide a first inverted multiplexer input to the multiplexer 32. The second resistor segment 22b further includes a second end electrically connected to a first end of the third resistor segment 22c and is configured to provide a second inverted multiplexer input to the multiplexer 32. The third resistor segment 22c further includes a second end electrically connected to the collector of the first NPN bipolar transistor 24a and to a first end of the fourth resistor 28 and is configured to provide a third inverted multiplexer input to the multiplexer 32. The fourth resistor 28 further includes a second end electrically connected to the second voltage reference $V_2$.

As illustrated in FIG. 3, the second voltage reference $V_2$ can be electrically connected to the second ends of second and fourth resistors 26, 28 to aid in establishing a common mode voltage for the collectors of the first and second NPN bipolar transistors 24a, 24b. However, in certain implementations, the second ends of the second and fourth resistors 26, 28 need not be connected to a voltage reference. For example, the second ends of the second and fourth resistors 26, 28 can be electrically connected to each other and left floating, and the common mode voltage of the collectors of the first and second NPN bipolar transistors 24a, 24b can be established at least in part by a common mode voltage level of the differential input voltage signal.

In one embodiment, the resistor segments 21a-21c and 22a-22c each have a resistance equal to about R. The resistor segments 21a-21c and 22a-22c can be implemented using any suitable method, including, for example, using polysilicon resistor segments having a geometry selected to achieve the desired resistance.

As shown in FIG. 3, the first and third resistors 25, 27 can include a plurality of resistive segments, each segment having a resistance equal to about the resistance of second and fourth resistors 26, 28. Constructing first and third resistors 25, 27 using segments having a resistance equal to about the resistance of second and fourth resistors 26, 28 can aid in reducing variation in resistance caused by process variation. However, skilled artisans will appreciate that first and third resistors 25, 27 can be constructed using resistive elements having a resistance different than the resistance of second and fourth resistors 26, 28. Additionally, although the resistor segments 21a-21c and 22a-22c are each shown as having the same resistance, the resistance of each resistor segment need not be the same. Additional details of the first and third resistors 25, 27 can be as described earlier.

The multiplexer 32 can receive first non-inverted and inverted multiplexer inputs, second non-inverted and inverted multiplexer inputs, and third non-inverted and inverted multiplexer inputs, corresponding to first, second and third differential multiplexer input voltages, respectively. The multiplexer 32 can provide a positive or non-inverted output voltage signal $V_{out+}$ and a negative or inverted output voltage signal $V_{out-}$, which can collectively form a differential output signal. The multiplexer 32 can also include a multiplexer select signal for selecting the differential input provided to the output of the multiplexer 32. For example, the multiplexer 32 can use the state of the multiplexer select signal to selectively connect the first, second or third differential multiplexer input voltages to the differential output voltage. The multiplexer 32 can be implemented using a plurality of independent multiplexers.

The DC attenuation and the zero of the equalizer 40 can vary depending on the differential input selected by the multiplexer, the resistance R, and the capacitance $C_{var}$ of the first and second programmable capacitors 29a, 29b. For example, the equalizer 40 can have a DC attenuation of about ¾ (about −2.5 dB), about ½ (about −6 dB), and about ¼ (about −12 dB), when the multiplexer 32 is configured to select first, second and third differential multiplexer inputs, respectively. Likewise, the equalizer 40 can have a zero at an angular frequency of about 1/(RC), about 1/(2RC), and about 1/(3RC), when the multiplexer 32 is configured to select first, second and third differential multiplexer inputs, respectively.

In one embodiment, the state of the multiplexer select signal can be set by a user of the equalizer 40. This permits a user to selectively tune the zero of the equalizer 40 to achieve a desire frequency response and DC attenuation. In embodiments in which the equalizer 40 is used to equalize a signal received at a receiver over an FR-4 backplane, different multiplexer differential input voltage selections can equalize different lengths of FR-4 trace.

As described above, the location of the zero of the equalizer 40 can be based on the capacitance of the first and second programmable capacitors 29a, 29b. Thus, the capacitance of the programmable capacitors 29a, 29b can be tuned to vary the frequency location of the zero.

In one embodiment, the capacitance of the programmable capacitors 29a, 29b is selected so that the RC product is substantially constant for equalizers manufactured on different dies. For example, the capacitance of the first and second programmable capacitors 29a, 29b can be selected using a plurality of select signals, which can be controlled using, for example, fuses or antifuses. Additionally, the resistance of resistors 25-28 or a resistor having similar construction to resistors 25-28 can be measured using any suitable technique, and the capacitance of the programmable capacitors 29a, 29b can be selected to achieve a desired RC product. This advantageously permits the RC product to be relatively constant from die to die, thereby permitting a user to tune the zero of the equalizer 40 to a desired frequency using the multiplexer 32.

Although the multiplexer 32 is illustrated for the case of selecting amongst three differential input voltages, skilled artisans will appreciate that the equalizer 40 can be configured to multiplex more or fewer differential input voltages. For example, the multiplexer can be configured to have between about 2 and about 50 inputs. Providing a multiplexer having a greater number of inputs can provide enhanced tunability of the zero of the equalizer 40. To accommodate a multiplexer with a greater number of inputs than three, the first and third resistors 25, 27 can include additional resistor segments. Additionally, although the resistor segments 21a-21c and 22a-22c are each shown as having a resistance of about R, the resistance of each resistor segment need not be the same. Depending on the size of the multiplexer 32, the multiplexer select signal can be one bit or more than one bit.

Although certain embodiments described above with reference to FIG. 3 have been described in the context of a transconductance block using NPN bipolar transistors, skilled artisans will recognize that certain embodiments can be applicable to a PNP configuration. Additionally, in certain embodiments, the transconductance block can be implemented using N-type or P-type field effect transistors, including, for example, N-type and/or P-type metal oxide semiconductor (MOS) devices. For example, the NPN bipolar transistor 24a can be replaced by an NMOS transistor having a source electrically connected to the node $N_1$, a gate electrically connected to the second end of the capacitor 23a, and a drain electrically connected to the second end of the resistor segment 22c. Similarly, the NPN bipolar transistor 24b can be replaced by an NMOS transistor having a source electrically connected to the node $N_2$, a gate electrically connected to the second end of the capacitor 23b, and a drain electrically connected to the second end of the resistor segment 21c.

Figure 4A:
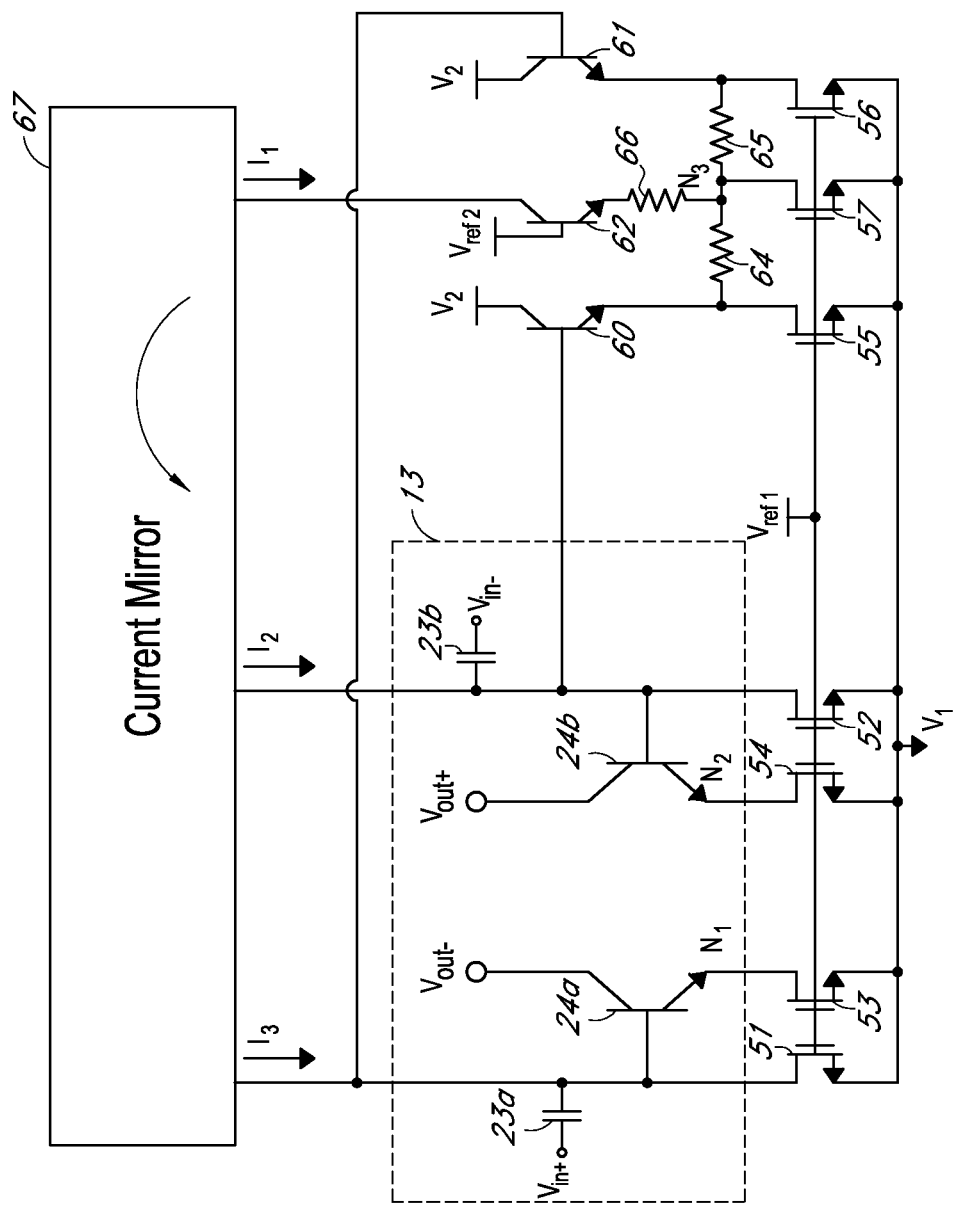
FIG. 4A is a circuit diagram of one embodiment of a bias circuit for the equalizer of FIG. 3.

FIG. 4A is a circuit diagram of one embodiment of a bias circuit for the equalizer of FIG. 3. The illustrated bias circuit can bias the transconductance buffer block 13, which includes first and second capacitors 23a, 23b and first and second NPN bipolar transistors 24a, 24b. The bias circuit includes first through seventh NMOS transistors 51-57, third through fifth bipolar transistors 60-62, first, second and third resistors 64-66, and current mirror 67.

Although the transconductance buffer block 13 is illustrated as being electrically connected to only the bias circuit, the transconductance buffer block 13 can be electrically connected to additional blocks, including, for example, a capacitor block 15 and/or one or more resistors. For example, as was described earlier, the emitters of first and second NPN bipolar transistors 24a, 24b can each be connected to programmable capacitors at nodes $N_1$ and $N_2$, respectively. Additionally, the collectors of the first and second NPN bipolar transistors 24a, 24b can be configured to generate a positive output voltage signal $V_{out+}$ and a negative output voltage signal $V_{out-}$, which can be provided to a multiplexer. Additional details of the transconductance buffer block 13 can be as described above.

The NMOS transistors 51-57 each include a gate, a drain and a source, and the bipolar transistors 60-62 each include an emitter, a base and a collector. The sources of NMOS transistors 51-57 can each be electrically connected to the first voltage reference $V_1$, and the gates of NMOS transistors 51-57 can each be electrically connected to a voltage $V_{ref1}$. The first voltage reference $V_1$ can be, for example, a negative power supply, and the voltage $V_{ref1}$ can be a bias voltage selected so as to control the current through NMOS transistors 51-57 to a desired value.

The drain of the first NMOS transistor 51 can be electrically connected to the bases of first and fourth NPN bipolar transistors 24a, 61 and to the second end of the capacitor 23a. The drain of the second NMOS transistor 52 can be electrically connected to the bases of second and third NPN bipolar transistor 24b, 60 and to the second end of the capacitor 23b. The drains of the third and fourth NMOS transistors 53, 54 can be electrically connected to the emitters of first and second NPN transistors 24a, 24b at nodes $N_1$ and $N_2$, respectively. The drain of the fifth NMOS transistor 55 can be electrically connected to the emitter of the third NPN bipolar transistor 60 and to a first end of the first resistor 64. The drain of the sixth NMOS transistor 56 can be electrically connected to the emitter of the fourth NPN bipolar transistor 61 and to a first end of the second resistor 65. The drain of the seventh NMOS transistor 57 can be electrically connected to a second end of the first resistor 64, to a second end of the second resistor 65, and to a first end of the third resistor 66 at a node labeled $N_3$.

As shown in FIG. 4A, the base of the third NPN bipolar transistor 60 can be electrically connected to base of the second NPN bipolar 24b, and the base of the fourth NPN bipolar transistor 61 can be electrically connected to the base of the first NPN bipolar transistor 24a. The collectors of the third and fourth NPN bipolar transistors 60, 61 can each be electrically connected to the second voltage reference $V_2$, which can be, for example, a positive power supply bias.

The base of the fifth NPN bipolar transistor 62 can be electrically connected to the reference voltage $V_{ref2}$, the emitter of the fifth NPN bipolar transistor 62 can be electrically connected to a second end of the third resistor 66, and the collector of the fifth NPN bipolar transistor 62 can be configured to provide a current $I_1$ to the current mirror 67. The current $I_1$ can be mirrored using the current mirror 67 to generate currents $I_2$ and $I_3$ for biasing the bases of first and second bipolar transistors 24a, 24b of the transconductance buffer block 13. The currents $I_2$ and $I_3$ can be selected to be substantially equal. The magnitudes of currents $I_1$, $I_2$ and $I_3$ can be a variety of values. For example, the current $I_1$ can be a current ranging between about 0.1 μA to about 100 mA, for example, about 50 μA, and the currents $I_2$ and $I_3$ can each be a current ranging between about 0.1 μA to about 100 mA, for example, about 100 μA.

The NPN bipolar transistors 60-62 can each be biased in the forward-active region. First and second resistors 64, 65 can be configured to have about equal resistances such that the node $N_3$ has a voltage equal to about the average voltage of the emitters of third and fourth NPN bipolar transistor 60, 61. In certain embodiments, the first and second NPN bipolar transistors 24a, 24b can be biased to have similar base-emitter voltage drops as third and fourth NPN bipolar transistors 60, 61 so that the voltage at node $N_3$ is also equal to about the average voltage of nodes $N_1$ and $N_2$.

The bias circuitry illustrated in FIG. 4A operates as a common mode voltage feedback loop for biasing the bases of the bipolar transistors 24a, 24b of the transconductance buffer block 13. In particular, the bias circuitry of FIG. 4A can serve to establish the voltage potential of the node $N_3$ to be equal to about $V_{ref2}$ minus the base-emitter voltage drop of the fifth bipolar transistor 62 and the voltage drop $V_{drop}$ across the third resistor 66, or $V_{ref2} - V_{BE} - V_{drop}$.

When the voltage of node $N_3$ is below the equilibrium voltage of about $V_{ref2} - V_{BE} - V_{drop}$, the magnitude of the current $I_1$ can increase relative to the magnitude at equilibrium, which can result in the currents $I_2$ and $I_3$ increasing. The increase in the currents $I_2$ and $I_3$ can increase the voltage at the bases of third and fourth NPN bipolar transistors 60, 61, which in turn can increase the voltage at the emitters of transistors 60, 61, respectively. The increase of the voltage at the emitters of the third and fourth NPN bipolar transistors 60, 61 can increase the voltage at the node $N_3$, thereby directing the voltage at the node $N_3$ toward the equilibrium voltage.

Similarly, when the voltage of node $N_3$ is above about $V_{ref2} - V_{BE} - V_{drop}$, the magnitude of the current $I_1$ can decrease relative to magnitude at equilibrium, which can result in the currents $I_2$ and $I_3$ decreasing. The decrease in the currents $I_2$ and $I_3$ can decrease the voltage at the bases of the third and fourth NPN bipolar transistors 60, 61, which in turn can decrease the voltage at the emitters of NPN bipolar transistors 60, 61. The decrease of the voltage at the emitters of NPN bipolar transistors 60, 61 can decrease the voltage at the node $N_3$, thereby moving the voltage at the node $N_3$ toward the equilibrium voltage.

The current mirror 67 can be any suitable current mirror, including, for example, a cascode current mirror, a Wilson current mirror, or the like. One embodiment of the current mirror is described below with reference to FIG. 4B.

Figure 4B:
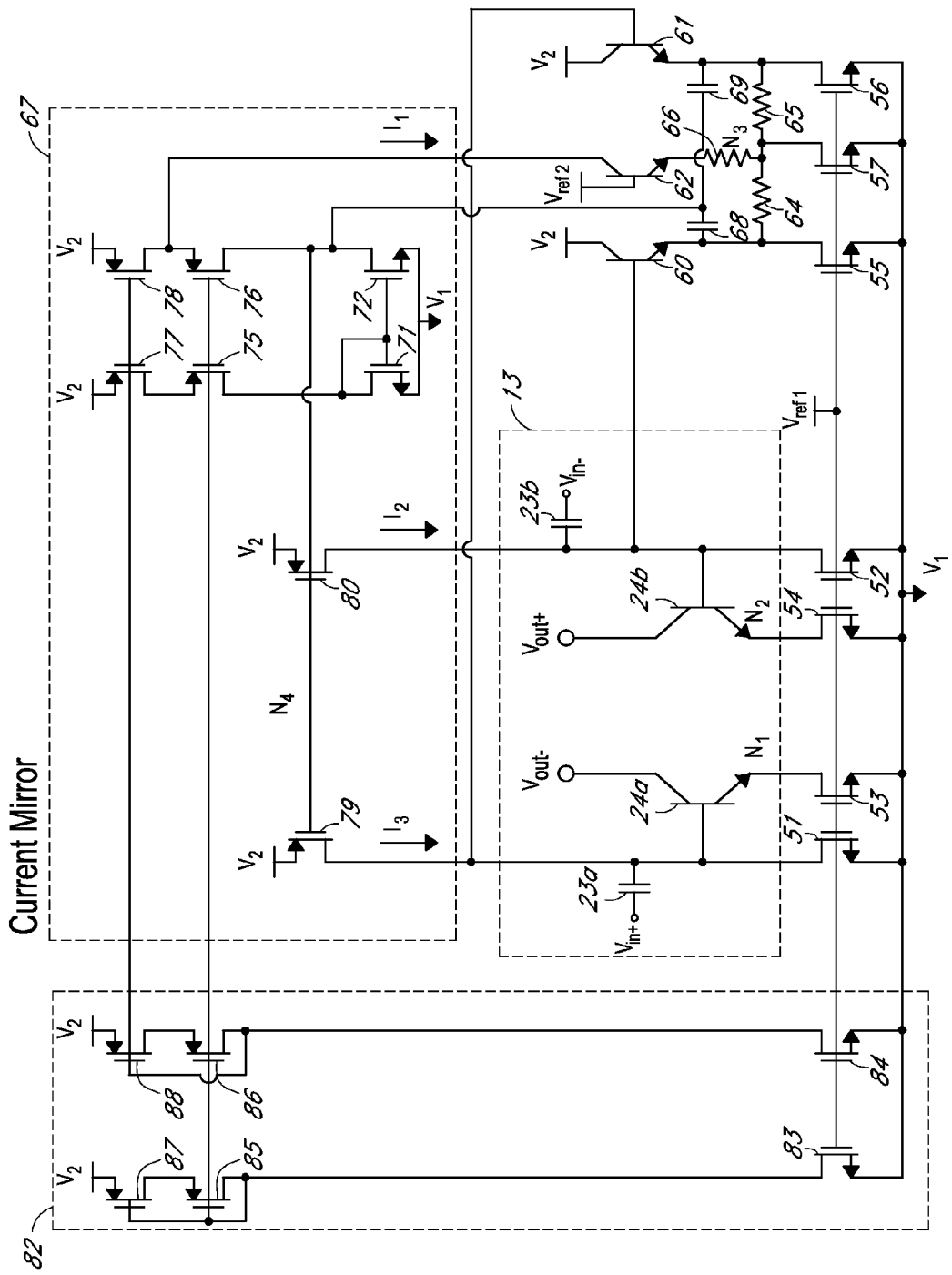
FIG. 4B is a circuit diagram of another embodiment of a bias circuit for the equalizer of FIG. 3.

FIG. 4B is a circuit diagram of another embodiment of a bias circuit for the equalizer of FIG. 3. The illustrated bias circuit is similar to bias circuit of FIG. 4A. However, the current mirror 67 of the illustrated bias circuit includes eighth and ninth NMOS transistors 71, 72 and first through sixth PMOS transistors 75-80. Additionally, the illustrated bias circuit includes first and second Miller capacitors 68, 69 and a current mirror bias circuit 82 having tenth and eleventh NMOS transistors 83, 84 and seventh through tenth PMOS transistors 85-88. Each NMOS transistor and PMOS transistor includes a gate, a drain and a source.

The sources of eighth and ninth NMOS transistors 71, 72 are electrically connected to the first voltage reference $V_1$. The gate of eighth NMOS transistor 71 is electrically to the gate of the ninth NMOS transistor 72, to the drain of the eighth NMOS transistor 71, and to the drain of the first PMOS transistor 75. The drain of the ninth NMOS transistor 72 is electrically connected to a first end of the first Miller capacitor 68, to a first end of the second Miller capacitor 69, to the drain of the second PMOS transistor 76, and to the gates of the fifth and sixth PMOS transistors 79, 80 at a node labeled $N_4$. A second end of the first Miller capacitor 68 is electrically connected to the emitter of the third NPN bipolar transistor 60, to the first end of first resistor 64, and to the drain of fifth NMOS transistor 55. A second end of the second Miller capacitor 69 is electrically connected to the emitter of the fourth NPN bipolar transistor 61, to the first end of the second resistor 65, and to the drain of the sixth NMOS transistor 56.

The sources of the fifth and sixth PMOS transistors 79, 80 are electrically connected to the second voltage reference $V_2$. The drain of the fifth PMOS transistor 79 is configured to generate the current $I_3$, and is electrically connected to the second end of first capacitor 23a, to the drain of first NMOS transistor 51, and to the bases of first and fourth NPN bipolar transistors 24a, 61. The drain of the sixth PMOS transistor 80 is configured to provide the current $I_2$, and is electrically connected to the second end of second capacitor 23b, to the drain of second NMOS transistor 52, and to the bases of second and third NPN bipolar transistors 24b, 60.

The gate of first PMOS transistor 75 is electrically connected to the gate of second PMOS transistor 76, to the drain of tenth NMOS transistor 83, to the drain of seventh PMOS transistor 85, and to the gates of seventh through ninth PMOS transistors 85-87. The source of first PMOS transistor 75 is electrically connected to the drain of third PMOS transistor 77, and the source of second PMOS transistor 76 is electrically connected to the drain of fourth PMOS transistor 78.

The sources of third and fourth PMOS transistors 77, 78 are each electrically connected to the second voltage reference $V_2$. The gate of third PMOS transistor 77 is electrically connected to the gate of fourth PMOS transistor 78, to the gate of tenth PMOS transistor 88, to the drain of eighth PMOS transistor 86, and to the drain of eleventh NMOS transistor 84. The source of the seventh PMOS transistor 85 is electrically connected to the drain of the ninth PMOS transistor 87, and the source of the eighth PMOS transistor 86 is electrically connected to the drain of the tenth PMOS transistor 88.

The gates of tenth and eleventh NMOS transistors are electrically connected to the reference voltage $V_{ref1}$. The sources of tenth and eleventh NMOS transistors are electrically connected to the first voltage reference $V_1$.

The current mirror 67 and current mirror bias block 82 can operate as a low-headroom current mirror, and can enhance the operation of the common mode voltage feedback loop for biasing the bases of the bipolar transistors 24a, 24b. As was described above, the common mode voltage feedback loop can establish the voltage potential of the node $N_3$ to be equal to about $V_{ref2}-V_{BE}-V_{drop}$.

When the voltage of node $N_3$ is below the equilibrium voltage, the magnitude of the current $I_1$ can increase relative to the magnitude at equilibrium, which can result in the voltage of the node $N_4$ decreasing. The decrease in the voltage of node $N_4$ can increase the currents $I_2$ and $I_3$. The increase in the currents $I_2$ and $I_3$ can increase the voltage at the bases of third and fourth NPN bipolar transistors 60, 61, which in turn can increase the voltage at the emitters of transistors 60, 61. The increase of the voltage at the emitters of third and fourth NPN bipolar transistors 60, 61 can increase the voltage at the node $N_3$, thereby directing the voltage at the node $N_3$ toward the equilibrium voltage of about $V_{ref2}-V_{BE}-V_{drop}$.

Similarly, when the voltage of node $N_3$ is above the equilibrium voltage, the magnitude of the current $I_1$ can decrease relative to the magnitude at equilibrium, which can increase the voltage at the node $N_4$ and decrease the magnitude of the currents $I_2$ and $I_3$. The decrease in the currents $I_2$ and $I_3$ can decrease the voltage at the bases of third and fourth NPN bipolar transistors 60, 61, which in turn can decrease the voltage at the emitters of NPN bipolar transistors 60, 61. The decrease of the voltage at the emitters of NPN bipolar transistors 60, 61 can decrease the voltage at the node $N_3$, thereby moving the voltage at the node $N_3$ toward the equilibrium voltage.

The first and second Miller capacitors 68, 69 can aid in providing enhanced loop stability. As persons of ordinary skill in the art will appreciate, a capacitor having a capacitance C disposed between a gain element having a gain of −A can have an equivalent capacitance of about $C*(1+A)$. Thus, to increase capacitance and to improve loop stability, it can be advantageous to position a capacitor across a negative gain element.

As shown in FIG. 4B, the first Miller capacitor 68 has been positioned between the gate of fifth PMOS transistor 79 and the emitter of third NPN bipolar transistor 60, and the second Miller capacitor 69 has been positioned between the gate of sixth PMOS transistor 80 and the emitter of fourth NPN bipolar transistor 61. Positioning the first and second Miller capacitors 68, 69 in this manner can enhance the equivalent capacitance of the capacitors and improve common mode loop stability, while avoiding attenuating the signal component of the differential input voltage signal provided to the bases of first and second NPN bipolar transistors 24a, 24b. For example, the illustrated approach can reduce attenuation of the differential input signal provided to the bases of first and second NPN bipolar transistors 24a, 24b relative to a design in which a Miller capacitor is provided between the gate and drain of the fifth PMOS transistor 79.

Figure 5A:
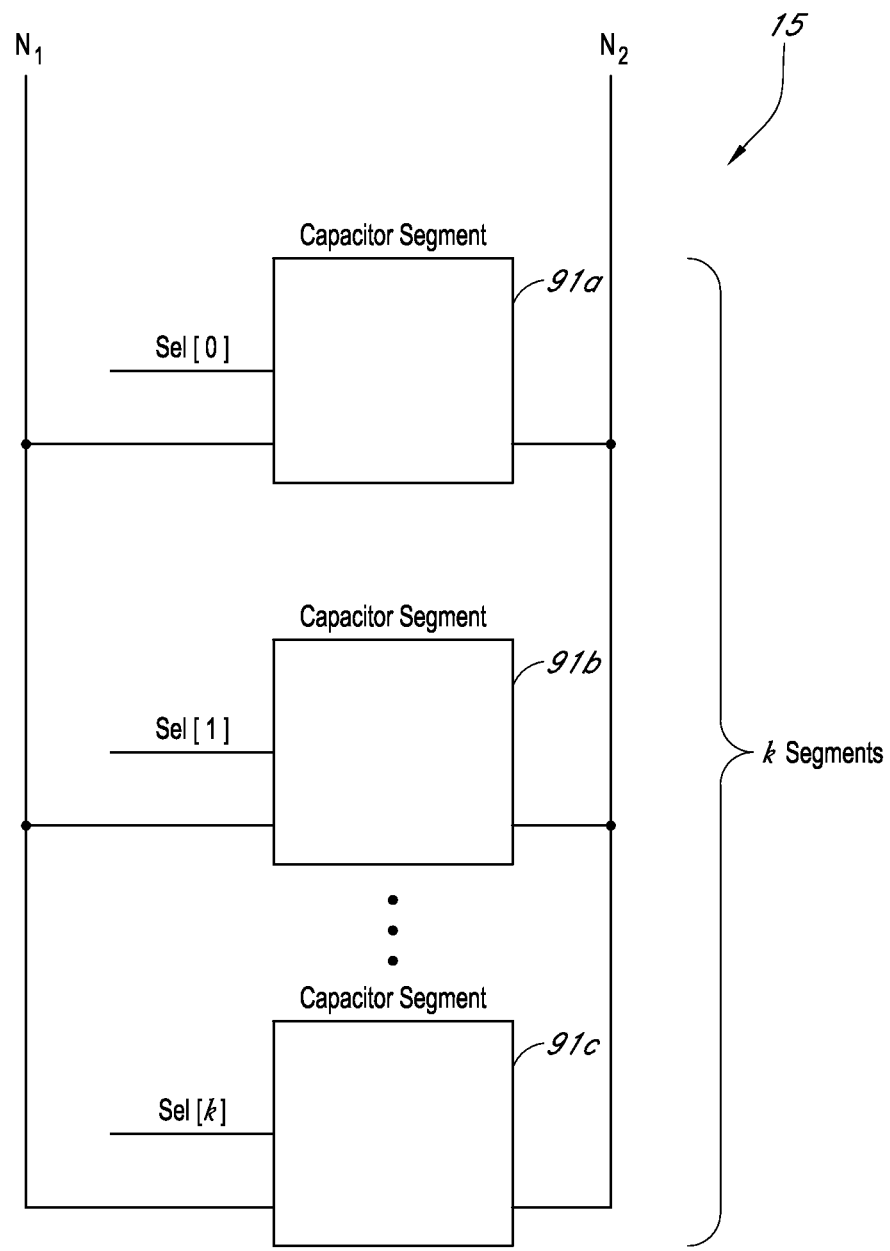
FIG. 5A is a block diagram of one embodiment of a programmable capacitor for an equalizer.

FIG. 5A is a block diagram of one embodiment of a programmable capacitor for an equalizer. The illustrated programmable capacitor 15 can be used, for example, in the equalizers of FIGS. 2B and 3.

The illustrated programmable capacitor 15 includes a first capacitor segment 91a, a second capacitor segment 91b, and a third capacitor segment 91c. Each capacitor segment is electrically connected between a node $N_1$ and a node $N_2$. The nodes $N_1$ and $N_2$ can be electrically connected to a transconductance buffer block, such as the transconductance buffer block 13, as was described earlier. The capacitor segments 91a-91c each receive a select signal for varying the capacitance of programmable capacitor 15. The select signals can be generated in any suitable manner, including from a digital decoder, such as a thermometer decoder. Alternatively, the select signals can be controlled by fuses and/or antifuses.

Although the programmable capacitor 15 is illustrated for the case of three capacitor segments, persons of ordinary skill in the art will appreciate that more or fewer capacitor segments can be used to achieve the desired degree of variation in capacitance. In one embodiment, the number of capacitor segments k is selected to be in the range of about 8 to about 32, for example, about 16.

Additionally, skilled artisans will appreciate that there are other ways to implement a programmable capacitor in addition to the configuration illustrated in FIG. 5A. For example, the programmable capacitor can be a variable capacitor having a capacitance which can be tuned using an analog bias signal.

Figure 5B:
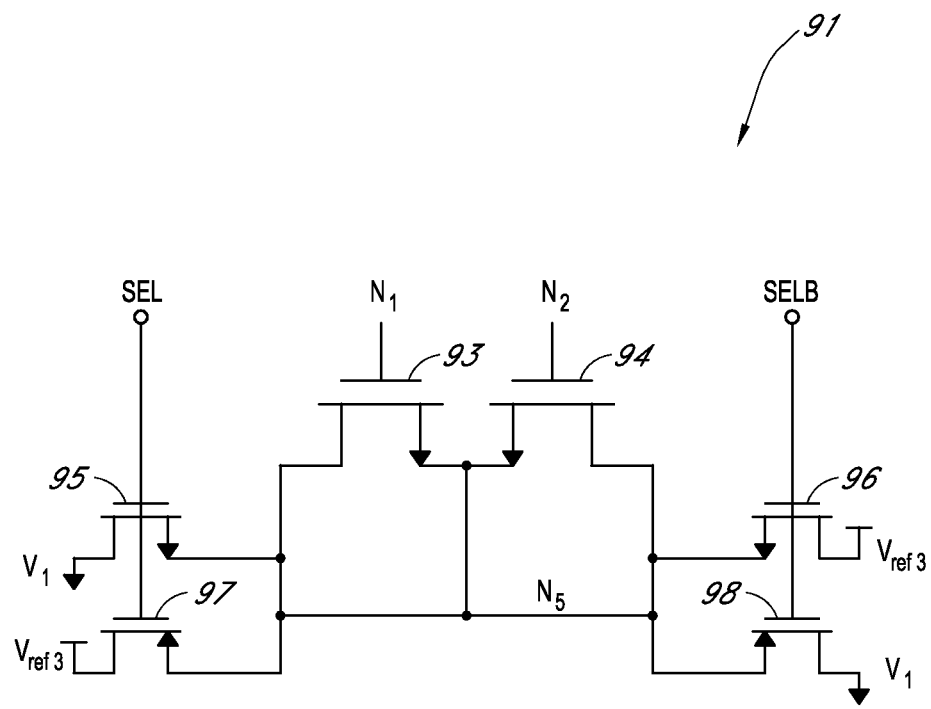
FIG. 5B is a circuit diagram of one embodiment of a capacitor segment for the programmable capacitor of FIG. 5A.

FIG. 5B is a circuit diagram of one embodiment of a capacitor segment for the programmable capacitor of FIG. 5A. The capacitor segment 91 includes a first NMOS transistor 93, second NMOS transistor 94, third NMOS transistor 95, fourth NMOS transistor 96, first PMOS transistor 97, and second PMOS transistor 98. Each transistor 93-98 includes a gate, a drain and a source.

The gate of first NMOS transistor 93 is electrically connected to the node $N_1$, and the drain of first NMOS transistor 93 is electrically connected to the drain of second NMOS transistor 94 and to the sources of transistors 93-98. The gates of third NMOS transistor 95 and first PMOS transistor 97 can be electrically connected to a select signal SEL, and the gates of fourth NMOS transistor 96 and second PMOS transistor 98 can be electrically connected to an inverted select signal SELB. The inverted select signal SELB can be a digital signal generated from the output of a digital inverter having an input configured to receive the select signal SEL. The drain of third NMOS transistor 95 and the drain of second PMOS transistor 98 are electrically connected to the first voltage reference $V_1$. The drain of fourth NMOS transistor 96 and first PMOS transistor 97 are electrically connected to a reference voltage $V_{ref3}$.

In one embodiment, the reference voltage $V_{ref3}$ is equal to about the average voltage of nodes $N_1$ and $N_2$. Skilled artisans will appreciate that there are a variety of ways to provide a reference voltage $V_{ref3}$ equal to about the average voltage of nodes $N_1$ and $N_2$. For example, with reference back to FIGS. 4A-4B, in certain embodiments, the voltage of the node $N_3$ can be equal to about the average voltage of nodes $N_1$ and $N_2$. Thus, the reference voltage $V_{ref3}$ can be generated using an NPN transistor biased similarly to the fifth NPN bipolar transistor 62 of FIG. 4B.

The capacitor segment 91 can have a capacitance which varies depending on the state of the select signal SEL and the inverted selected signal SELB. For example, when the select signal SEL is high and the inverted select signal SELB is low, the voltage of node $N_5$ can be equal to about the first voltage reference $V_1$. The first voltage reference $V_1$ can be a negative power supply, and can have a voltage relatively lower than that of nodes $N_1$ and $N_2$. In another embodiment, the first voltage reference $V_1$ can be ground. Thus, when the select signal SEL is high, the first and second NMOS transistors 93, 94 can operate in an inversion region of operation and the capacitor segment 91 can have a relatively high capacitance. When the select signal SEL is low and the inverted select signal SELB is high, the voltage of node $N_5$ can be equal to about the reference voltage $V_{ref3}$. The reference voltage $V_{ref3}$ can be selected so that first and second NMOS transistors 93, 94 operate in a depletion region of operation and have a relatively low capacitance. For example, the reference voltage $V_{ref3}$ can be equal to about the average voltage of nodes $N_1$ and $N_2$.

Figure 6A:
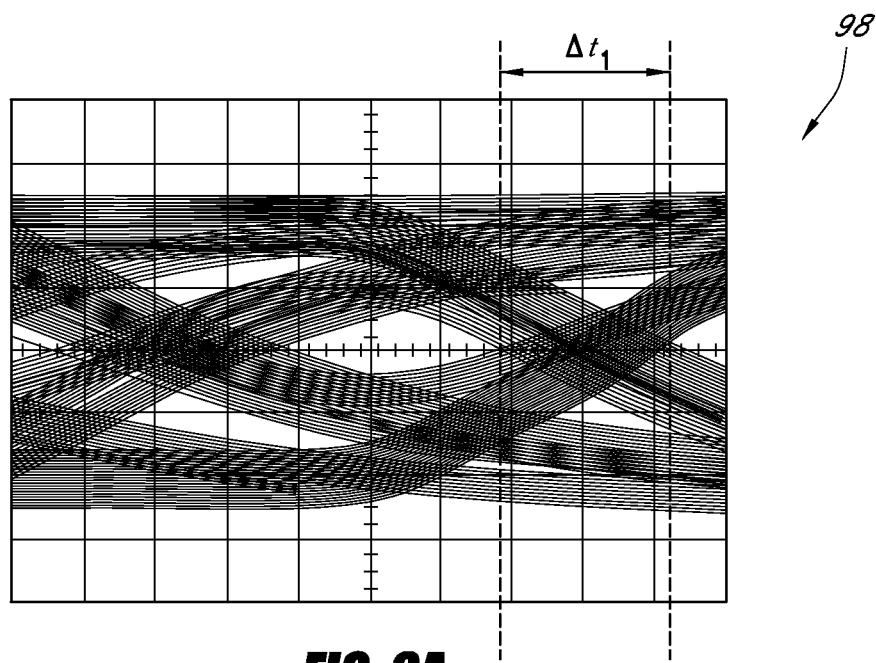
FIG. 6A is an eye diagram based on laboratory measurements taken for a receiver not using an equalizer.

FIG. 6A is an eye diagram 98 based on laboratory measurements taken for a receiver not using an equalizer. The illustrated eye diagram 98 is based on measurements made at the receiver using an oscilloscope and a pattern generator configured to transmit signals over about 40 inches of PC board trace. The bit rate is about 4.25 Gbps, and the oscilloscope has a division ratio of about 1:1. The receiver has a jitter $\Delta t_1$ of about 123.6 ps.

Figure 6B:
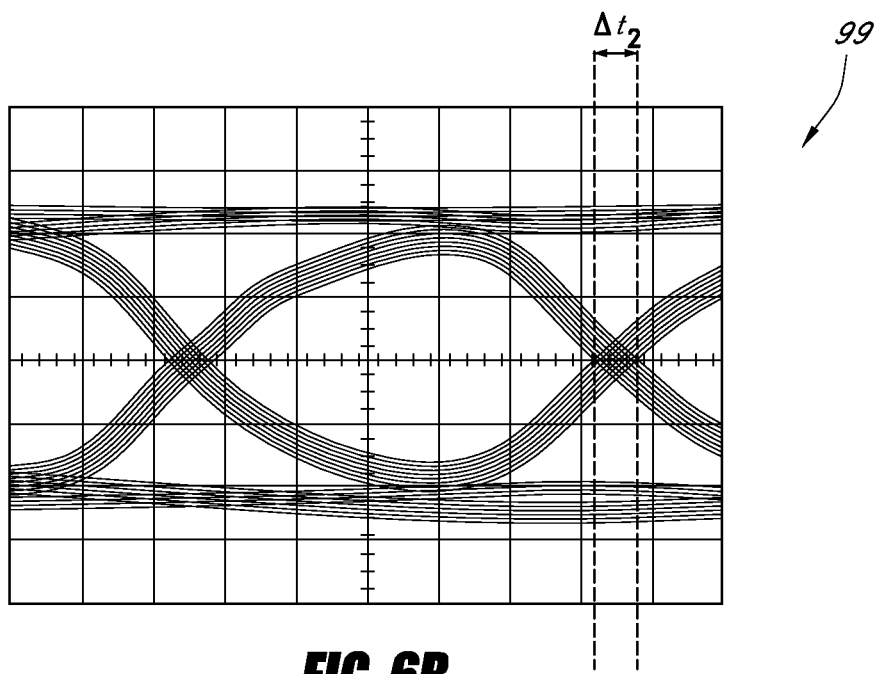
FIG. 6B is an eye diagram based on laboratory measurements taken for a receiver using the equalizer of FIG. 3.

FIG. 6B is an eye diagram 99 based on laboratory measurements taken for a receiver using the equalizer of FIG. 3. The illustrated eye diagram 99 is based on measurements made at the receiver using an oscilloscope and a pattern generator configured to transmit signals over about 40 inches of PC board trace. The bit rate is about 4.25 Gbps, and the oscilloscope has a division ratio of about 1:1. The receiver has a jitter $\Delta t_2$ of about 22.2 ps.

FIGS. 7A-7E show circuit diagrams of various examples of transconductance buffers for use with the equalizers of FIGS. 2A-2B.

Figure 7A:
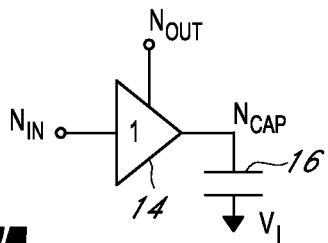
FIGS. 7A-7E show circuit diagrams of various examples of transconductance buffers for use with the equalizers of FIGS. 2A-2B.

FIG. 7A is a circuit diagram of one example of a transconductance buffer 14 that is electrically connected to a capacitor 16. The transconductance buffer 14 includes an input electrically connected to an input node $N_{in}$, and a current output for generating a current from the node $N_{cap}$ to the node $N_{out}$ that is equal to about the input voltage divided by the impedance of the capacitor 16. In certain implementations, the current I can be given by equation (1) described earlier, where $g_m$ is the transconductance of the transconductance buffer 14, $\omega$ is the angular frequency of the input voltage signal $V_{in}$ received on the node $N_{in}$, and C is the capacitance of the capacitor 16. As described earlier, the ratio of the transconductance $g_m$ to the capacitance C can be selected to be greater than angular frequency $\omega$ so as to generate a current from the transconductance buffer 14 that is about equal to about the input voltage divided by the impedance of the capacitor 16.

Figure 7B:
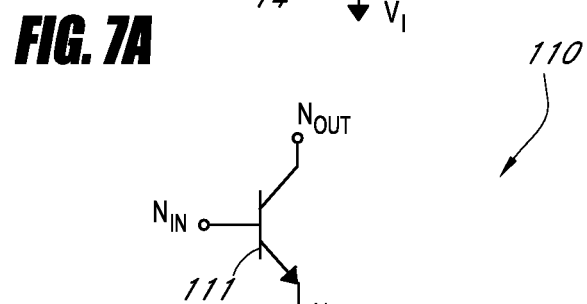

FIG. 7B is a circuit diagram of another example of a transconductance buffer block 110 for use with the equalizers of FIGS. 2A-2B. The transconductance buffer block 110 includes an NPN bipolar transistor 111 that includes a base electrically connected to the node $N_{in}$, a collector electrically connected to the node $N_{OUT}$, and an emitter electrically connected to the node $N_{CAP}$. When a capacitor is electrically connected to the node $N_{CAP}$, the NPN bipolar transistor 111 can generate a current from the collector to the emitter that is equal to about the input voltage received on the base divided by the impedance of the capacitor.

Figure 7C:
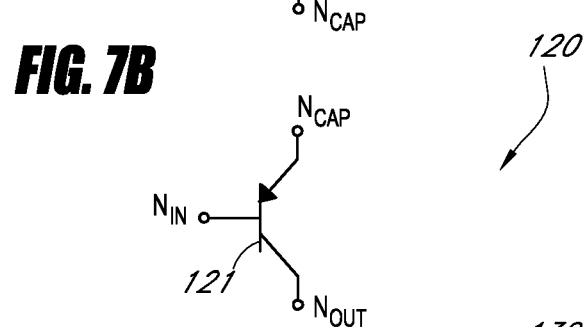

FIG. 7C is a circuit diagram of another example of a transconductance buffer 120 for use with the equalizers of FIGS. 2A-2B. The transconductance buffer 120 includes a PNP bipolar transistor 121 that includes a base electrically connected to the node $N_{in}$, a collector electrically connected to the node $N_{OUT}$, and an emitter electrically connected to the node $N_{CAP}$. When a capacitor is electrically connected to the node $N_{CAP}$, the PNP bipolar transistor 121 can generate a current from the collector to the emitter that is equal to about the input voltage received on the base divided by the impedance of the capacitor.

Figure 7D:
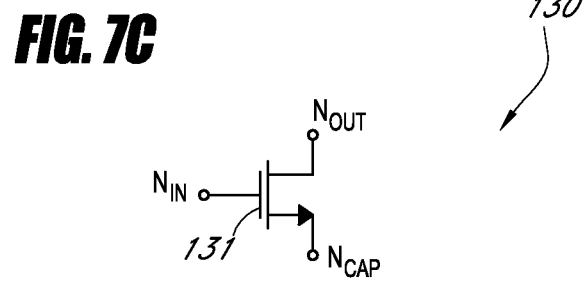

FIG. 7D is a circuit diagram of another example of a transconductance buffer 130 for use with the equalizers of FIGS. 2A-2B. The transconductance buffer 130 includes a NMOS transistor 131 that includes a gate electrically connected to the node $N_{in}$, a drain electrically connected to the node $N_{OUT}$, and a source electrically connected to the node $N_{CAP}$. When a capacitor is electrically connected to the node $N_{CAP}$, the NMOS transistor 131 can generate a current from the drain to the source that is equal to about the input voltage received at the gate divided by the impedance of the capacitor.

Figure 7E:
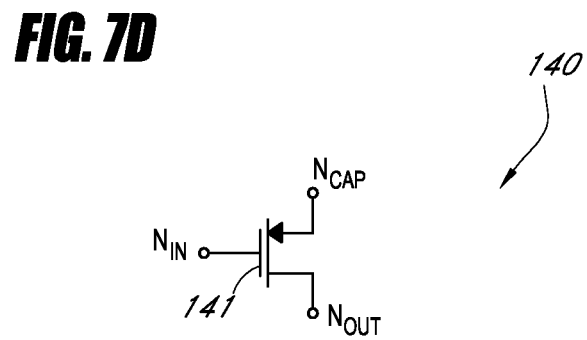

FIG. 7E is a circuit diagram of another example of a transconductance buffer 140 for use with the equalizers of FIGS. 2A-2B. The transconductance buffer 140 includes a PMOS transistor 141 that includes a gate electrically connected to the node $N_{in}$, a drain electrically connected to the node $N_{OUT}$, and a source electrically connected to the node $N_{CAP}$. When a capacitor is electrically connected to the node $N_{CAP}$, the PMOS transistor 141 can generate a current from the drain to the source that is equal to about the input voltage received at the gate divided by the impedance of the capacitor.

As persons of ordinary skill in the art will appreciate, equalizers as described herein can compensate for high-frequency signal loss, and can improve transmitting signals over a transmission line at relatively high speeds.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
a capacitor block having a first terminal and a second terminal;
a first resistor having a first end and a second end, the first end configured to receive a first input voltage of a differential input voltage;
a second resistor having a first end electrically connected to the second end of the first resistor at a first output node;
a third resistor having a first end and a second end, the first end configured to receive a second input voltage of the differential input voltage, the third resistor having a resistance equal to about that of the first resistor;
a fourth resistor having a first end electrically connected to the second end of the third resistor at a second output node, the fourth resistor having a resistance equal to about that of the second resistor;
a first transconductance buffer configured to receive the first input voltage and to generate a first current from the second output node to the first terminal of the capacitor block, the first current proportional to about the first input voltage; and
a second transconductance buffer configured to receive the second input voltage and to generate a second current from the first output node to the second terminal of the capacitor block, the second current proportional to about the second input voltage,
wherein the first and second output nodes are configured to provide a first differential output.

2. The apparatus of claim 1, wherein the capacitor block comprises a first capacitor and a second capacitor, the second capacitor having a capacitance equal to about that of the first capacitor, wherein the first capacitor includes a first end electrically connected to the first terminal of the capacitance block, and wherein the second capacitor includes a first end electrically connected to the second terminal of the capacitance block, and a second end electrically connected to a second end of the first capacitor.

3. The apparatus of claim 2, wherein the first current has a magnitude equal to about the first input voltage divided by the impedance of the first capacitor, and wherein the second current has a magnitude equal to about the second input voltage divided by the impedance of the second capacitor.

4. The apparatus of claim 2, wherein the first and second capacitors are programmable capacitors.

5. The apparatus of claim 4, wherein the first programmable capacitor includes a plurality of capacitor segments and a plurality of select signals for controlling the capacitance of each of the plurality of capacitor segments.

6. The apparatus of claim 5, wherein the plurality of capacitor segments includes a first capacitor segment and the plurality of select signals includes a first select signal, the first capacitor segment comprising:
a first metal-oxide-semiconductor (MOS) transistor having a gate, a drain and a source, the source electrically connected to the drain at a first junction, and the gate electrically connected to the first terminal of the capacitor block; and
a second MOS transistor having a gate, a drain, and a source, the source of the second MOS transistor electrically connected to the drain of the second MOS transistor and to the first junction, and the gate of the second MOS transistor electrically connected to the second terminal of the capacitor block,
wherein a voltage potential of the first junction is controlled by the first select signal.

7. The apparatus of claim 4, wherein the capacitance of at least one of the first and second programmable capacitors is selected so as to compensate for a process variation of at least one of the capacitor block, the first resistor, the second resistor, the third resistor and the fourth resistor.

8. The apparatus of claim 4, wherein the capacitance of at least one of the first and second programmable capacitors is selected so as to adjust a location of a zero in a transfer function of the apparatus.

9. The apparatus of claim 2, wherein the first transconductance buffer includes a first coupling capacitor and a first bipolar transistor, the first bipolar transistor having a base electrically connected to a first end of the first coupling capacitor, an emitter electrically connected to the first end of the first capacitor, and a collector electrically connected to the second output node, the first coupling capacitor further including a second end configured to receive the first input voltage, and wherein the second transconductance buffer includes a second coupling capacitor and a second bipolar transistor, the second bipolar transistor having a base electrically connected to a first end of the second coupling capacitor, an emitter electrically connected to the first end of the second capacitor, and a collector electrically connected to the first output node, the second coupling capacitor including a second end configured to receive the second input voltage.

10. The apparatus of claim 9, wherein the first and second bipolar transistors are NPN bipolar transistors.

11. The apparatus of claim 10, further comprising a common mode bias circuit for biasing the bases of the first and second NPN bipolar transistors.

12. The apparatus of claim 10, wherein the common mode bias circuit includes a fifth resistor, a sixth resistor, a seventh resistor, a third NPN bipolar transistor, a fourth NPN bipolar transistor, a fifth NPN bipolar transistor, and a current mirror, the third, fourth and fifth NPN bipolar transistors each having an emitter, a base, and a collector, the bases of the third and fourth NPN bipolar transistors electrically connected to the bases of the first and second NPN bipolar transistors, respectively, wherein the fifth resistor includes a first end electrically connected to the emitter of the third NPN bipolar transistor and a second end electrically connected to a first end of the sixth resistor and to a first end of the seventh resistor, and wherein the sixth resistor further includes a second end electrically connected to the emitter of the fourth NPN bipolar transistor, and wherein the base of the fifth NPN bipolar transistor is electrically connected to a common mode voltage reference, and wherein the emitter of the fifth NPN bipolar transistor is electrically connected to a second end of the seventh resistor, and wherein the current mirror is configured to receive a third current from the collector of the fifth NPN bipolar transistor and to mirror the current to generate a fourth current and a fifth current for biasing the bases of the first and second NPN bipolar transistors, respectively.

13. The apparatus of claim 12, wherein the current mirror includes a first PMOS transistor having a drain for generating the fourth current, wherein the common mode bias circuit includes a first Miller capacitor having a first end electrically connected to the gate of the first PMOS transistor and a second end electrically connected to the emitter of the third NPN bipolar transistor.

14. The apparatus of claim 13, wherein the current mirror includes a second PMOS transistor having a drain for generating the fifth current, wherein the common mode bias circuit includes a second Miller capacitor having a first end electrically connected to the gate of the second PMOS transistor and a second end electrically connected to the emitter of the fourth NPN bipolar transistor.

15. The apparatus of claim 9, wherein the first and second bipolar transistors are PNP bipolar transistors.

16. The apparatus of claim 2, wherein the first transconductance buffer includes a first coupling capacitor and a first metal oxide semiconductor (MOS) transistor, the first MOS transistor having a gate electrically connected to a first end of the first coupling capacitor, a source electrically connected to the first end of the first capacitor, and a drain electrically connected to the second output node, the first coupling capacitor further including a second end configured to receive the first input voltage, and wherein the second transconductance buffer includes a second coupling capacitor and a second MOS transistor, the second MOS transistor having a gate electrically connected to a first end of the second coupling capacitor, a source electrically connected to the first end of the second capacitor, and a drain electrically connected to the first output node, the second coupling capacitor including a second end configured to receive the second input voltage.

17. The apparatus of claim 1, wherein a sum of the resistances of the first and second resistors ranges between about 50Ω to about 10 Mega-Ω, and wherein a sum of the resistances of the third and fourth resistors ranges between about 50Ω to about 10 Mega-Ω.

18. The apparatus of claim 1, wherein the first resistor comprises a first plurality of resistor segments electrically connected end-to-end in series and having at least one intermediate node, and wherein the second resistor comprises a second plurality of resistor segments electrically connected end-to-end in series and having at least one intermediate node, the at least one intermediate node of the first plurality of resistor segments and the at least one intermediate node of the second plurality of resistors corresponding to at least one differential output, and wherein the apparatus further comprises a multiplexer for selecting amongst the at least one differential output and the first differential output.

19. The apparatus of claim 18, wherein the first and third resistors each comprise a first resistor segment, a second resistor segment, a third resistor segment, a first intermediate node and a second intermediate node, the first intermediate node positioned between the first and second resistor segments of each resistor, and the second intermediate node positioned between the second and third resistor segments of each resistor, and wherein the first intermediate nodes of the first and third resistors form a second differential output and the second intermediate nodes of the first and third resistors form a third differential output, and wherein the multiplexer is configured to select amongst the first, second or third differential outputs.

20. The apparatus of claim 19, wherein the resistance of the first, second, and third resistor segments of the first and third resistors each have a resistance equal to about that of the second and fourth resistors.

21. The apparatus of claim 18, further comprising a receiver for receiving the differential input signal over a transmission line.

22. The apparatus of claim 18, wherein the transmission line includes a backplane or PCB trace, and wherein the multiplexer is configured to select amongst the first, second, or third differential outputs so as to change a gain of the apparatus to equalize a length of trace of the backplane or PCB trace.

23. The apparatus of claim 1, wherein the second and fourth resistor each include a second end electrically connected to a voltage reference.

\* \* \* \* \*